United States Patent
Yeh

(10) Patent No.: US 11,616,071 B2
(45) Date of Patent: *Mar. 28, 2023

(54) NOR MEMORY CELL WITH VERTICAL FLOATING GATE

(71) Applicant: GREENLIANT IP, LLC, Santa Clara, CA (US)

(72) Inventor: Bing Yeh, Los Altos Hills, CA (US)

(73) Assignee: GREENLIANT IP, LLC, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/385,793

(22) Filed: Jul. 26, 2021

(65) Prior Publication Data

US 2021/0358932 A1    Nov. 18, 2021

Related U.S. Application Data

(63) Continuation of application No. 16/825,808, filed on Mar. 20, 2020, now Pat. No. 11,075,214, which is a
(Continued)

(51) Int. Cl.
*H01L 27/11556* (2017.01)
*H01L 21/28* (2006.01)
(Continued)

(52) U.S. Cl.
CPC .... *H01L 27/11556* (2013.01); *G11C 16/0416* (2013.01); *G11C 16/10* (2013.01);
(Continued)

(58) Field of Classification Search
CPC ......... H01L 27/11556; H01L 29/40114; H01L 23/5222; H01L 27/11521; H01L 29/42328;
(Continued)

(56) References Cited

U.S. PATENT DOCUMENTS 7,192,832 B2   3/2007   Chang et al.
9,293,204 B2   3/2016   Do et al.
(Continued)

FOREIGN PATENT DOCUMENTS

CN    101022112 A    8/2007
CN    101419972 A    4/2009
(Continued)

OTHER PUBLICATIONS

Greenliant IP LLC, International Search Report / Written Opinion, PCT/US2018/049875, dated Nov. 27, 2018, 11pgs.
(Continued)

*Primary Examiner* — Huan Hoang
(74) *Attorney, Agent, or Firm* — Morgan, Lewis & Bockius LLP

(57) ABSTRACT

An electrically erasable programmable nonvolatile memory cell includes a semiconductor substrate having a first substrate region and a trench region apart from the first substrate region in a lateral direction, a channel region between the first substrate region and the bottom portion of the trench region, an electrically conductive control gate insulated from and disposed over the first channel portion, an electrically conductive floating gate insulated from the bottom and sidewall portions of the trench region, an insulation region disposed over the second channel portion between the control gate and the second floating gate portion, an electrically conductive source line insulated from the floating gate and electrically connected to the trench region of the substrate, and an electrically conductive erase gate insulated from and disposed over a tip of the floating gate.

22 Claims, 9 Drawing Sheets

Related U.S. Application Data continuation of application No. 16/122,800, filed on Sep. 5, 2018, now Pat. No. 10,600,797.

(60) Provisional application No. 62/559,418, filed on Sep. 15, 2017.

(51) Int. Cl.

| | | |
|---|---|---|
| *G11C 16/26* | (2006.01) | |
| *H01L 29/788* | (2006.01) | |
| *H01L 27/11521* | (2017.01) | |
| *H01L 29/66* | (2006.01) | |
| *G11C 16/10* | (2006.01) | |
| *G11C 16/04* | (2006.01) | |
| *G11C 16/14* | (2006.01) | |
| *G11C 16/24* | (2006.01) | |
| *H01L 23/522* | (2006.01) | |
| *H01L 29/423* | (2006.01) | |

(52) U.S. Cl.
CPC .............. *G11C 16/14* (2013.01); *G11C 16/24* (2013.01); *G11C 16/26* (2013.01); *H01L 23/5222* (2013.01); *H01L 27/11521* (2013.01); *H01L 29/40114* (2019.08); *H01L 29/42328* (2013.01); *H01L 29/42336* (2013.01); *H01L 29/66825* (2013.01); *H01L 29/7881* (2013.01); *G11C 2216/04* (2013.01)

(58) Field of Classification Search
CPC ......... H01L 29/42336; H01L 29/66825; H01L 29/7881; G11C 16/0416; G11C 16/10; G11C 16/14; G11C 16/24; G11C 14/26; G11C 2216/04
USPC ...................................................... 365/185.18
See application file for complete search history.

(56) References Cited

U.S. PATENT DOCUMENTS

| | | | |
|---|---|---|---|
| 9,583,640 | B1 | 2/2017 | Richter et al. |
| 10,600,797 | B2* | 3/2020 | Yeh ..................... H01L 29/7881 |
| 10,756,100 | B2* | 8/2020 | Yeh ................... H01L 29/66825 |
| 11,075,214 | B2* | 7/2021 | Yeh .................... G11C 16/0416 |
| 11,101,277 | B2 | 8/2021 | Yeh |
| 2004/0183118 | A1 | 9/2004 | Chen et al. |
| 2004/0183121 | A1 | 9/2004 | Yeh et al. |
| 2004/0238852 | A1 | 12/2004 | Lee et al. |
| 2005/0045940 | A1 | 3/2005 | Chen |
| 2006/0043459 | A1 | 3/2006 | Chen |
| 2006/0157773 | A1 | 7/2006 | Yu et al. |
| 2006/0223262 | A1 | 10/2006 | Zheng et al. |
| 2006/0234444 | A1 | 10/2006 | Wu |
| 2007/0262368 | A1 | 11/2007 | Chang et al. |
| 2008/0042183 | A1 | 2/2008 | Mokhlesi |
| 2011/0057247 | A1 | 3/2011 | Hu et al. |
| 2019/0027487 | A1 | 1/2019 | Chen et al. |
| 2019/0088667 | A1 | 3/2019 | Yeh |
| 2019/0088668 | A1 | 3/2019 | Yeh |
| 2019/0165115 | A1 | 5/2019 | Lin et al. |
| 2020/0303387 | A1 | 9/2020 | Yeh |
| 2020/0365608 | A1 | 11/2020 | Yeh |

FOREIGN PATENT DOCUMENTS

| | | | |
|---|---|---|---|
| CN | 104091802 | A | 10/2014 |
| EP | 1059673 | A2 | 12/2000 |
| JP | 2001057395 | A | 2/2001 |
| JP | 2001085544 | A | 3/2001 |
| JP | 2001223281 | A | 8/2001 |
| JP | 2001284473 | A | 10/2001 |
| JP | 2003303908 | A | 10/2003 |
| TW | 411626 | B | 11/2000 |

OTHER PUBLICATIONS

Greenliant IP LLC, International Search Report / Written Opinion, PCT/US2018/049877, dated Nov. 29, 2018, 9pgs.
Greenliant IP LLC, International Preliminary Reporton Patentability, PCT/US2018/049875, dated Mar. 17, 2020, 9 pgs.
Greenliant IP LLC, International Preliminary Reporton Patentability, PCT/US2018/049877, dated Mar. 17, 2020, 7 pgs.
Yeh, Non-Final Office Action, U.S. Appl. No. 16/122,800, dated Jul. 10, 2019, 7 pgs.
Yeh, Notice of Allowance, U.S. Appl. No. 16/122,800, dated Nov. 18, 2019, 7 pgs.
Yeh, Notice of Allowance, U.S. Appl. No. 16/824,384, dated Feb. 12, 2021, 8 pgs.
Yeh, Notice of Allowance, U.S. Appl. No. 16/824,384, dated Apr. 15, 2021, 8 pgs.
Yeh, Notice of Allowance, U.S. Appl. No. 16/825,808, dated Apr. 14, 2021, 2 pgs.
Yeh, Notice of Allowance, U.S. Appl. No. 16/825,808, dated Jun. 14, 2021, 2 pgs.
Yeh, Notice of Allowance, U.S. Appl. No. 16/824,384, dated Jul. 21, 2021, 2 pgs.
Yeh, Non-Final Office Action, U.S. Appl. No. 16/122,795, dated Aug. 28, 2019, 19 pgs.
Yeh, Final Office Action, U.S. Appl. No. 16/122,795, dated Dec. 27, 2019, 16 pgs.
Yeh, Notice of Allowance, U.S. Appl. No. 16/122,795, dated Apr. 8, 2020, 8 pgs.
Yeh, Notice of Allowance, U.S. Appl. No. 16/122,795, dated May 6, 2020, 8 pgs.
Greenliant IP LLC, International Search Report / Written Opinion, PCT/US2020/023925, dated Jul. 7, 2020, 10 pgs.
Greenliant IP LLC, International Preliminary Report on Patentability, PCT/US2020/023925, dated Sep. 16, 2021, 8 pgs.
Greenliant Systems, Ltd., JP Office Action, Japanese Application No. 2020-508322, dated Sep. 27, 2022, 5 pgs.
Greenliant Systems, Ltd., JP Office Action, Japanese Application No. 2020-508343, dated Oct. 19, 2022, 19 pgs.
Greenliant Systems, Ltd., TW Office Action, Taiwanese Application No. 107127198, dated Mar. 2, 2021, 7 pgs.
Greenliant Systems, Ltd., TW Office Action, Taiwanese Application No. 107127199, dated Mar. 5, 2021, 12 pgs.
Greenliant Systems, Ltd., TW Office Action, Taiwanese Application No. 109109513, dated Jul. 6, 2022, 4 pgs.
Greenliant Systems, Ltd., U.S. Non-Final Office Action, U.S. Appl. No. 16/825,808, dated Oct. 5, 2020, 7 pgs.
Greenliant Systems, Ltd., U.S. Notice of Allowance, U.S. Appl. No. 16/825,808, dated Nov. 30, 2020, 5 pgs.
Greenliant Systems, Ltd., U.S. Notice of Allowance, U.S. Appl. No. 16/825,808, dated Dec. 31, 2020, 2 pgs.
Greenliant Systems, Ltd., U.S. Notice of Allowance, U.S. Appl. No. 16/825,808, dated Mar. 26, 2021, 8 pgs.
Greenliant Systems, Ltd., EP Office Action, European Application No. 18780267.3, dated Nov. 14, 2022, 4 pgs.
Greenliant Systems, Ltd., EP Office Action, European Application No. 20719042.2, dated Oct. 17, 2022, 4 pgs.

* cited by examiner

NOR MEMORY CELL WITH VERTICAL FLOATING GATE

RELATED APPLICATIONS

This application is a continuation of U.S. patent application Ser. No. 16/825,808, filed Mar. 20, 2020, which is a continuation of U.S. patent application Ser. No. 16/122,800, filed Sep. 5, 2018, now U.S. Pat. No. 10,600,797, which claims priority to U.S. Provisional Application No. 62/559,418, filed Sep. 15, 2017, each of which is hereby incorporated by reference in its entirety.

This application is related to U.S. patent application Ser. No. 16/122,795, filed Sep. 5, 2018, entitled "NOR Memory Cell with L-Shaped Floating Gate," now U.S. Pat. No. 10,756,100, which claims priority to U.S. Provisional Application No. 62/559,414, filed Sep. 15, 2017, entitled "NOR Memory Cell with L-Shaped Floating Gate," each of which is hereby incorporated by reference in its entirety.

TECHNICAL FIELD

This relates generally to semiconductor memory devices, including but not limited to electrically programmable and erasable nonvolatile memory cells, sometimes called NOR memory cells, having a vertical floating gate.

BACKGROUND

While programming a nonvolatile semiconductor memory cell array, e.g., a stacked-gate memory cell in which each memory cell has a floating gate and a control gate, in order to "inject" electrons onto the floating gate, accelerated electrons traveling in a depletion region must collide with impurities or lattice imperfections in the substrate to generate momentum in a direction toward the floating gate. Further, only those electrons having sufficient velocity in the direction of the floating gate to overcome the energy barrier at the silicon-oxide interface (i.e., substrate-gate oxide interface) plus the potential change across the floating gate oxide will be injected onto the floating gate. As a result, only a small percentage of electrons (e.g., on the order of one in one million) from the programming current in the depletion region will have sufficient energy to be injected onto the floating gate.

In addition, programming electrons often experience an electric field in the depletion region that is unfavorable in the direction of the floating gate. The electric field accelerates the electrons in various directions away from the floating gate. As a result, only a small percentage of electrons from the programming current will have sufficient energy to overcome the unfavorable electric field and be injected onto the floating gate.

SUMMARY

Accordingly, there is a need to improve the programming efficiency of nonvolatile memory cells, such as NOR memory cells. Such methods and devices optionally complement or replace conventional methods and devices for programming, erasing, and reading data in nonvolatile memory cells. Such methods and devices improve the programming efficiency of nonvolatile memory cells by disposing a first portion of a vertically-oriented floating gate inside a trench in the substrate, which puts the floating gate in the path of the electron current during programming. Having a portion of the floating gate disposed in the path of the programming current allows electrons to be accelerated in the direction of the path in which they are already traveling, which thereby causes more electrons (e.g., a large proportion of the electrons in the programming current) to have proper momentum orientation (sometimes referred to herein as "sufficient energy") to be injected onto the floating gate.

Such methods and devices further improve the programming efficiency of nonvolatile memory cells by disposing a second portion of a vertically-oriented floating gate outside of the trench and adjacent to an insulation layer that is wide enough to sustain, without dielectric breakdown in the substrate, a favorable electric field in the direction of the floating gate, attracting electrons in the programming current to the surface of the substrate, thereby further keeping the electrons on a trajectory that leads to the floating gate, which further causes more electrons (e.g., a large proportion of the electrons in the programming current) to have sufficient energy for injection onto the floating gate.

In accordance with some embodiments, an electrically erasable programmable nonvolatile memory cell, sometimes called a NOR memory cell, includes a semiconductor substrate having a first substrate region and a trench region apart from the first substrate region in a lateral direction, the trench region having a bottom portion and a sidewall portion adjacent a trench in the semiconductor substrate. The memory cell further includes a channel region between the first substrate region and the bottom portion of the trench region, the channel region having a first channel portion adjacent to the first substrate region, a second channel portion adjacent to the first channel portion and the trench region, and a third channel portion adjacent to the second channel portion and including the sidewall portion of the trench region. For the purposes of this disclosure, "channel region" and "channel portion" are used to describe an area or a path through which electrons flow in certain circumstances. The memory cell further includes an electrically conductive control gate insulated from and disposed over the first channel portion, and an electrically conductive floating gate insulated from the bottom and sidewall portions of the trench region. The floating gate includes a first floating gate portion disposed inside the trench, and a second floating gate portion longer than the first floating gate portion, disposed above the trench and extending away from the trench. The second floating gate portion is electrically connected to the first floating gate portion on a first end and has a tip on a second end. A first portion of the tip has a smaller cross section than a second portion of the tip. The memory cell further includes an insulation region disposed over the second channel portion between the control gate and the second floating gate portion, and an electrically conductive source line electrically connected to the trench region, the source line extending away from the substrate (e.g., away from the bottom of the trench) and forming a first capacitive coupling with the floating gate. The memory cell further includes a dielectric layer between the floating gate and the source line, and an electrically conductive erase gate insulated from and disposed over the tip of the second floating gate portion.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact, unless the context clearly indicates otherwise.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when," or "upon," or "in response to determining," or "in response to detecting," depending on the context. Similarly, the phrase "if it is determined" or "if [a stated condition or event] is detected" is, optionally, construed to mean "upon determining," or "in accordance with a determination that," or "in response to determining" or "upon detecting [the stated condition or event]" or "in response to detecting [the stated condition or event]," depending on the context.

Figure 1A:
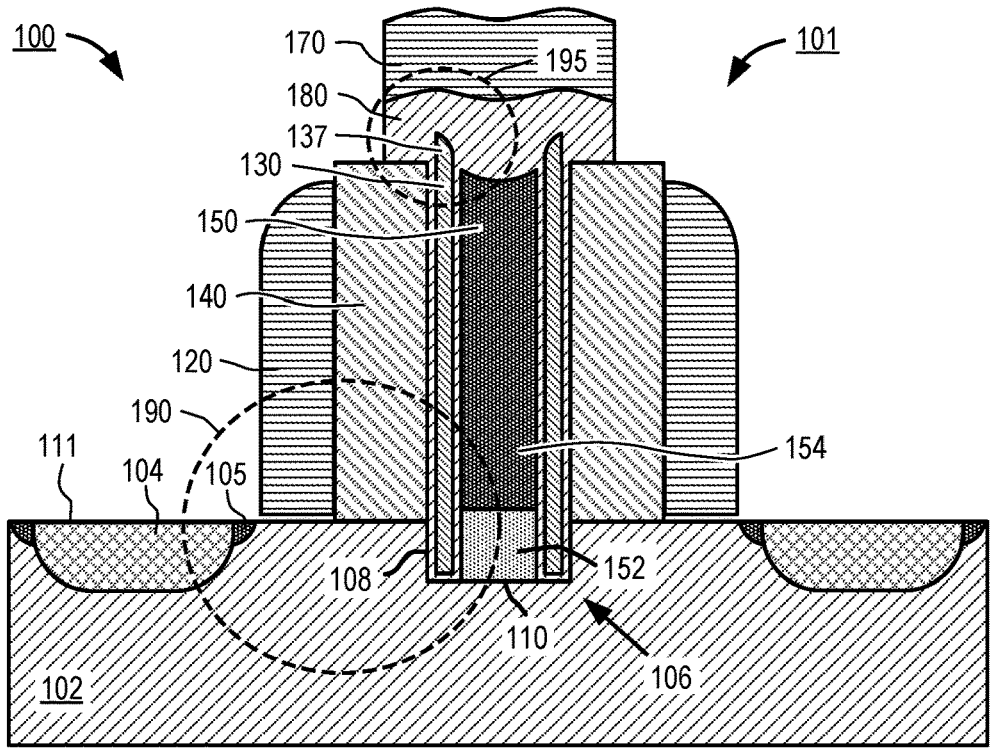
FIG. 1A is a diagram illustrating a cross section view of a pair of electrically erasable programmable nonvolatile memory cells in accordance with some embodiments.
Figure 1B:
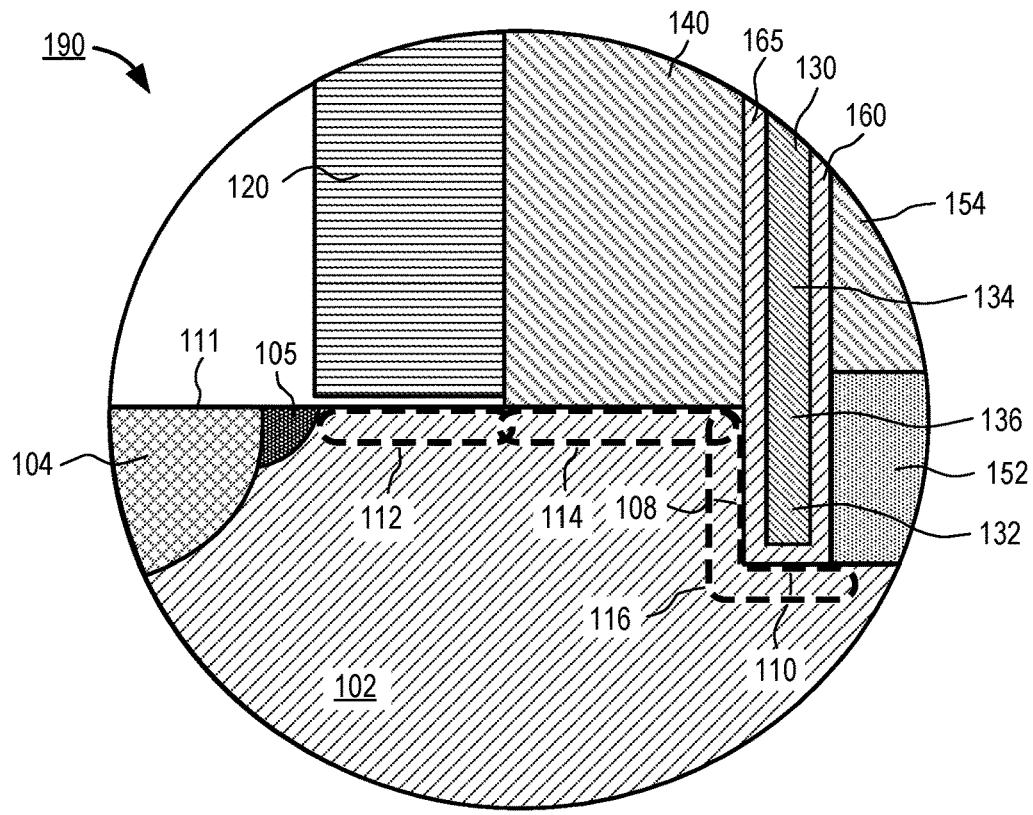
FIG. 1B is a cutout illustration of a channel portion of the memory cell of FIG. 1A in accordance with some embodiments.
Figure 1C:
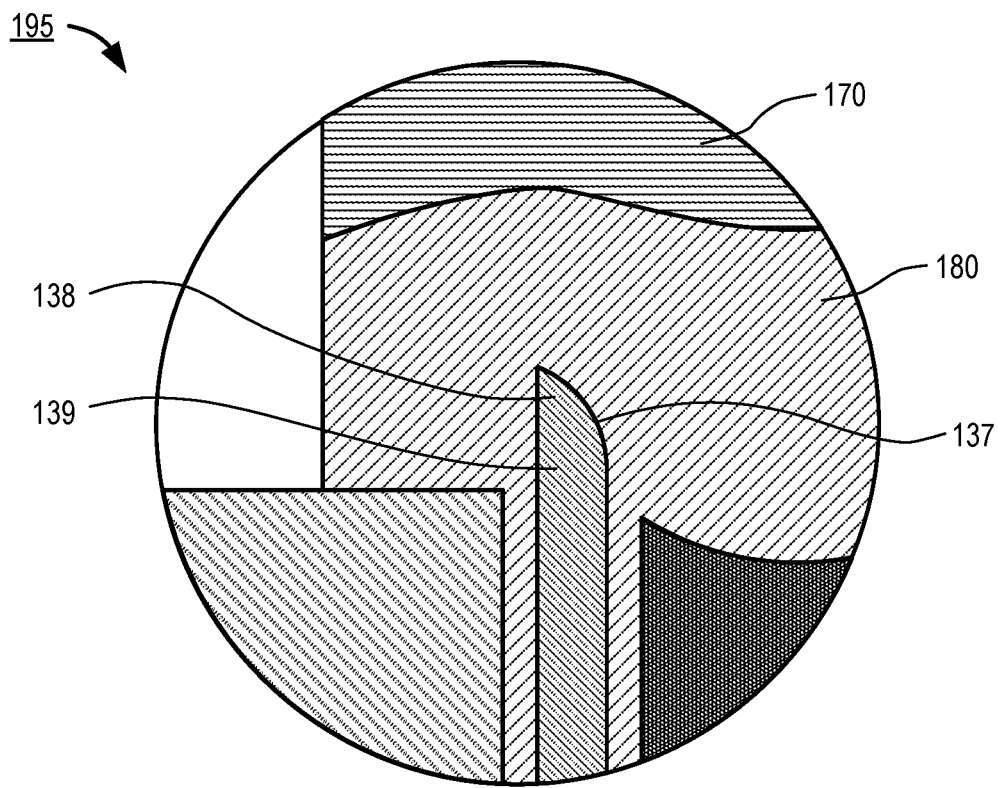
FIG. 1C is a cutout illustration of an erase portion of the memory cell of FIG. 1A in accordance with some embodiments.

Attention is now directed toward embodiments of an electrically erasable programmable nonvolatile memory cell, sometimes called a NOR memory cell or split-gate NOR memory cell, in accordance with some embodiments. FIG. 1A is a cross section of a pair of memory cells 100, 101. The memory cells mirror each other, with a memory cell formed on each side of, and including, a shared source line 150. In the interest of brevity, the remainder of this disclosure references only one memory cell, memory cell 100. However, it is appreciated that neighboring memory cell 101 has corresponding features and behaves similarly under similar circumstances. Additionally, cutouts 190 and 195 in FIG. 1A are illustrated in FIGS. 1B and 1C, respectively, for clarity. Features shared through FIGS. 1A-C are similarly numbered, and some are not further discussed for purposes of brevity.

In some embodiments, memory cell 100 includes a semiconductor substrate 102 having a first substrate region 104 (sometimes called a drain region) and a trench region 106. In some embodiments, the first substrate region 104 serves as a drain, although it is appreciated that the source and drain of a transistor can be switched during operation. Furthermore, in some embodiments, the drain includes substrate region 104 as well as substrate region 105, where region 105 is a shallower doped region (e.g., a moderately N-doped region in a P doped substrate) than region 104. Trench region 106 of substrate 102 comprises a bottom portion, adjacent to trench bottom 110, and a sidewall portion, adjacent to trench sidewall 108. Memory cell 100 further includes a channel region comprising a first channel portion 112, a second channel portion 114, and a third channel portion 116. In some embodiments, first channel portion 112 is disposed adjacent to drain region 104. In some embodiments, second channel portion 114 is disposed between the first channel portion 112 and the sidewall portion of trench region 106 (adjacent to trench sidewall 108). In some embodiments, third channel portion 116 is disposed adjacent to second channel portion 114 and comprises the sidewall portion of trench region 106 (adjacent to trench sidewall 108) and a portion of the bottom portion of trench region 106 (adjacent to a portion of trench bottom 110). Substrate 102 further includes a horizontal surface 111, disposed over the drain region 104 and extending in a lateral direction towards the sidewall portion of trench region 106. In some embodiments, at least a portion of surface 111 is a silicon-oxide interface (e.g., between a silicon substrate and an oxide-based insulation region). For the purposes of this disclosure, the term "trench" describes a region from which substrate material has been removed, and thus an absence of substrate material, while the terms "trench region," "bottom portion," and "sidewall portion" describe regions of the substrate adjacent to a trench.

In some embodiments, memory cell 100 further includes an electrically conductive control gate 120 insulated from and disposed over at least a portion of the first channel portion 112, an electrically conductive floating gate 130 insulated from the bottom portion (adjacent trench bottom 110) and sidewall portion (adjacent trench sidewall 108) of trench region 106, and an insulation region 140 (sometimes referred to as a gate separation insulation region, or an oxide layer) disposed over at least a portion of the second channel portion 114 between control gate 120 and floating gate 130.

It is noted that while control gate 120 is disposed over first channel portion 112, control gate 120 is not disposed over second channel portion 114 and third channel portion 116. As a result, when an inversion layer is formed in a portion of first channel portion 112 underneath a portion of control gate 120 due to an appropriate read mode control voltage or programming mode control voltage being applied to control gate 120, at least a portion of second channel portion 114 does not include an inversion layer. In other words, while the inversion layer in first channel portion 112 may, in some circumstances or in some embodiments, extend partially into second channel portion 114, that inversion layer does not extend into other portions of second channel portion 114. In some embodiments, second channel portion 114 has a lateral dimension, corresponding to the distance between first channel portion 112 and third channel portion 116. In some embodiments, for devices implemented in deep submicron technology nodes, the distance between first and third channel portions 112 and 116 is between 20 and 100 nanometers.

In some embodiments, floating gate 130 includes a first floating gate portion 132 disposed inside the trench, and a second floating gate portion 134 disposed above the trench and extending away from the trench. In some embodiments, second floating gate portion 134 is longer than first floating gate portion 132; however, in other embodiments, the first floating gate portion 132 is longer than second floating gate portion 134. In some embodiments, second floating gate portion 134 has a first end 136 at which second floating gate portion 134 is electrically connected to first floating gate portion 132. In some embodiments, second floating gate portion 134 has a second end 137 including a tip (see FIG. 1C) with a first tip portion 138 and a second tip portion 139. In some embodiments, the first tip portion 138 has a smaller cross section than the second tip portion 139. Second end 137 is sometimes herein called a pointed tip, and the ratio of the cross section of first tip portion 138 to the cross section of second tip portion 139 is sometimes used as a measure of the sharpness of the pointed tip.

In some embodiments, the memory cell 100 further includes an electrically conductive source line 150 electrically connected to the bottom portion of trench region 106 through trench bottom 110. Source line 150 extends away from the substrate. In some embodiments, source line 150 includes a first source line portion 152 disposed at least partially inside the trench and electrically connected to the bottom portion of trench region 106, and a second source line portion 154 disposed above the first source line portion 152. In some embodiments, at least a portion of second source line portion 154 is disposed outside the trench. In some embodiments, first source line portion 152 is relatively lightly doped (e.g., n− polysilicon), and the second source line portion 154 is more heavily doped (e.g., n+ polysilicon). In some embodiments, first source line portion 152 is lightly doped polysilicon that has been converted into single crystal silicon.

In some embodiments, memory cell 100 further includes a dielectric layer 160 between at least a portion of the floating gate 130 and at least a portion of the source line 150. In some embodiments, dielectric layer 160 is a "thin" dielectric layer, so as to provide a strong capacitive coupling between floating gate 130 and source line 150. In some embodiments, dielectric layer 160 comprises a combination of oxide and nitride, or other high dielectric constant material. In some embodiments, dielectric layer 160 has a combined total thickness between 6 nm and 10 nm.

In some embodiments, memory cell 100 further includes an insulation layer 165 between at least a portion of the floating gate 130 and at least a portion of trench sidewall 108. In some embodiments, insulation layer 165 comprises a combination of oxide and nitride, or other high dielectric constant material. In some embodiments, compared with a conventional silicon oxide layer, insulation layer 165 provides a lower interface energy barrier (sometimes called an energy barrier height) for hot electrons to overcome in order to be injected into the floating gate 130. In some embodiments, the low interface energy barrier provided by the dielectric material of insulation layer 165 is less than 2.5 eV (electron volts), and in some embodiments is less than 2.0 eV, or less than 1.3 eV.

In some embodiments, memory cell 100 further includes an electrically conductive erase gate 170 insulated from and disposed over the top of the second floating gate portion 137. Erase gate 170 is insulated from the second floating gate portion 137 by an insulation layer 180, sometimes called an erase gate insulation region, disposed between the erase gate and the second floating gate portion. In some embodiments, erase gate 170 is further disposed over at least a portion of the source line 150. In some embodiments, the capacitive coupling between floating gate 130 and erase gate 170 is much weaker than the capacitive coupling between floating gate 130 and source line 150, which is beneficial for efficiently and quickly erasing the memory cell (explained in more detail below). In some embodiments, the capacitive coupling between the floating gate and the source line is greater than the capacitive coupling between the floating gate and the erase gate by a ratio of at least 5 to 1 (i.e., the capacitive coupling ratio is at least 5 to 1), and in some embodiments the capacitive coupling ratio, of the capacitive coupling between the floating gate and the source line to the capacitive coupling between the floating gate and the erase gate, is at least 10 to 1, or 9 to 1, or 2 to 1. The strong capacitive coupling between the floating gate and the source line (compared to the capacitive coupling between the floating gate and the erase gate) is caused by the proximity of the floating gate to the source line, as well as the large surface area of the vertical face of the floating gate that is in close proximity to the source line.

In some embodiments, similar capacitive coupling ratios exist for the floating gate and the source line versus the floating gate and the control gate. More specifically, in some embodiments, the capacitive coupling between the floating gate and the source line is greater than the capacitive coupling between the floating gate and the control gate by a ratio of at least 5 to 1 (i.e., the capacitive coupling ratio is at least 5 to 1), and in some embodiments the capacitive coupling ratio, of the floating gate-source line capacitive coupling to the floating gate-control gate capacitive coupling, is at least 10 to 1, or 9 to 1, or 2 to 1.

In some embodiments, conductive elements of the memory cell 100 (e.g., control gate 120, floating gate 130, source line 150, and/or erase gate 170) are constructed of appropriately doped polysilicon. It is appreciated that "polysilicon" refers to any appropriate conductive material, formed at least in part from silicon or metal material, that can be used to form the conductive elements of nonvolatile memory cells. In addition, in accordance with some embodiments, insulation elements of the memory cell 100 (e.g., insulation regions 140 and 180) are constructed of silicon dioxide, silicon nitride, and/or any appropriate insulator that can be used to form the insulation elements of nonvolatile memory cells.

Attention is now drawn to the channel portions of memory cell 100, as illustrated in FIG. 1B. In some embodiments, first and second channel portions 112 and 114 form a continuous channel region extending from drain region 104 to the sidewall portion of trench region 106, in the lateral direction. Additionally, first and second channel portions 112 and 114 extend in the vertical direction to include substrate surface 111. In some embodiments, first and second channel portions 112 and 114 are adjacent to each other or overlap with each other, and in some embodiments, the first channel portion 112 overlaps with the drain region 104. In some embodiments, third channel portion 116 extends from the substrate surface 111 to the bottom portion of trench region 106 (adjacent to a portion of trench bottom 110), and is adjacent the sidewall portion of trench region 106 (adjacent to trench sidewall 108). In some embodiments, third channel portion 116 is adjacent to or overlaps with second channel portion 114, forming a continuous channel region from drain region 104 to the portion of trench region 106 that is adjacent the trench bottom 110 and underneath source line 150 (see channel portion 116 in FIG. 1B). In some embodiments, the continuous channel region formed by portions 112, 114, and 116 is non-coplanar, as the sidewall portion of channel portion 116 (adjacent to trench sidewall 108) extends substantially perpendicular to the lateral direction in which channel portions 112 and 114 extend, and the bottom portion of channel portion 116 (adjacent to trench bottom 110) extends substantially perpendicular to the direction of the sidewall portion of channel portion 116. In some embodiments, "substantially perpendicular" means an angle within a range of 75 to 105 degrees.

Figure 2:
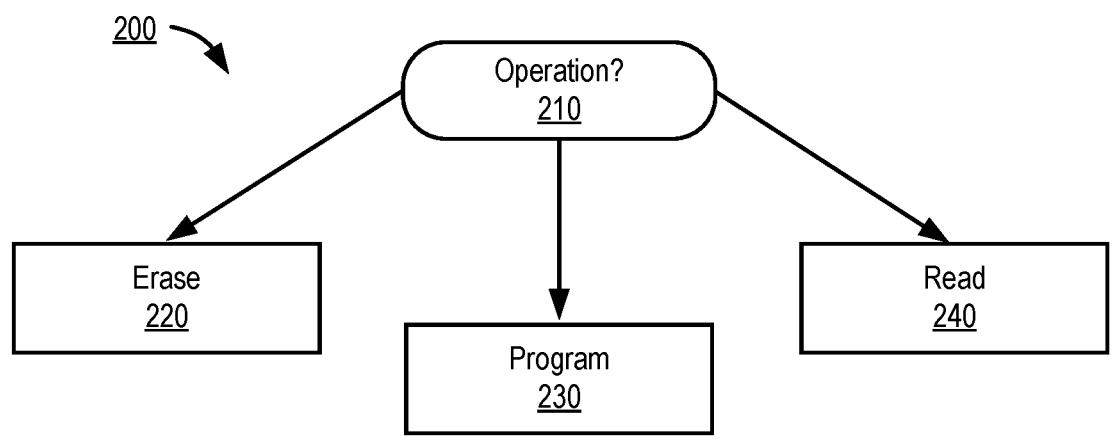
FIG. 2 is a flow chart illustrating operation flow in an electrically erasable programmable nonvolatile memory cell in accordance with some embodiments.

Operation of the memory cell 100 in accordance with some embodiments will now be described. FIG. 2 is a flow chart illustrating an operation flow 200 for a memory cell 100 in accordance with some embodiments. Operation flow 200 begins at step 210, at which a memory controller proceeds to either erase memory cell 100 (e.g., while erasing a row of memory cells including memory cell 100) (step 220), program a memory cell 100 that has previously been erased (step 230), or read from a memory cell 100 that has previously been programmed or erased (step 240). In some embodiments, operation flow 200 includes concurrent erase and program operations on different memory cells, and in some embodiments, operation flow 200 includes concurrent erase and read operations on different memory cells.

Erase Operation

To erase a row of memory cells including a memory cell 100 (step 220) in accordance with some embodiments, a first bias potential (e.g., ground potential) is applied to both the control gate 120 and the source line 150, and a second bias potential (e.g., a positive potential) is applied to the erase gate 170. Typically, a difference between the second bias potential and the first bias potential is no greater than 10 volts. Since the floating gate 130 is highly capacitively coupled to the source line 150, the floating gate potential is pulled down to, or held at, a potential just above the ground potential, also herein simply called "ground" or "circuit ground." As a nonlimiting example, for a capacitance ratio of 10/1 (i.e., the floating gate to source line capacitance is ten times the floating gate to erase gate capacitance), if the erase gate potential changes from 0V to 10V (e.g., to start an erase operation) and the source line potential is maintained at 0V, the 10V change in potential in the erase gate causes a change in the floating gate potential of less than 1V.

The difference in potentials between the floating gate and erase gate causes electrons to leave the floating gate. More specifically, electrons on the floating gate 130 are induced through the Fowler-Nordheim tunneling mechanism (or equivalents thereof) to tunnel from the upper portion 134 of the floating gate (e.g., primarily from pointed tip 137), through the insulation layer 180, and onto the erase gate 170, leaving the floating gate 130 positively charged. Tunneling of electrons through insulation layer 180, from tip 137 of floating gate 130 to erase gate 170, is enhanced by the sharpness of tip 137. While traditional memory cells may have required 14V or higher for erasing, currently disclosed embodiments require application of no greater than 10V to erase gate 170 (e.g., the voltage applied to erase gate 170, relative to the voltage applied to control gate 120 and source line 150, is no greater than +10V), and even less (e.g., 8V) in some embodiments. In addition to the capacitance ratio, the pointed tip 137 of the floating gate 130 also contributes to the lower erase voltage. In particular, the pointed tip 137 of floating gate 130 facilitates the formation of a tightly focused electric field between floating gate 130 and erase gate 170, which in turn facilitates electron tunneling through insulation layer 180, thereby allowing the use of lower erase voltages for any given thickness of insulation layer 180. For example, if a planar floating gate without a pointed tip normally requires an insulation thickness (layer 180) of less than 100 angstroms, having a pointed tip 137 allows the insulation thickness to be up to 700 angstroms and still permit tunneling when only 10V is applied to the erase gate.

Program Operation

Figure 3:
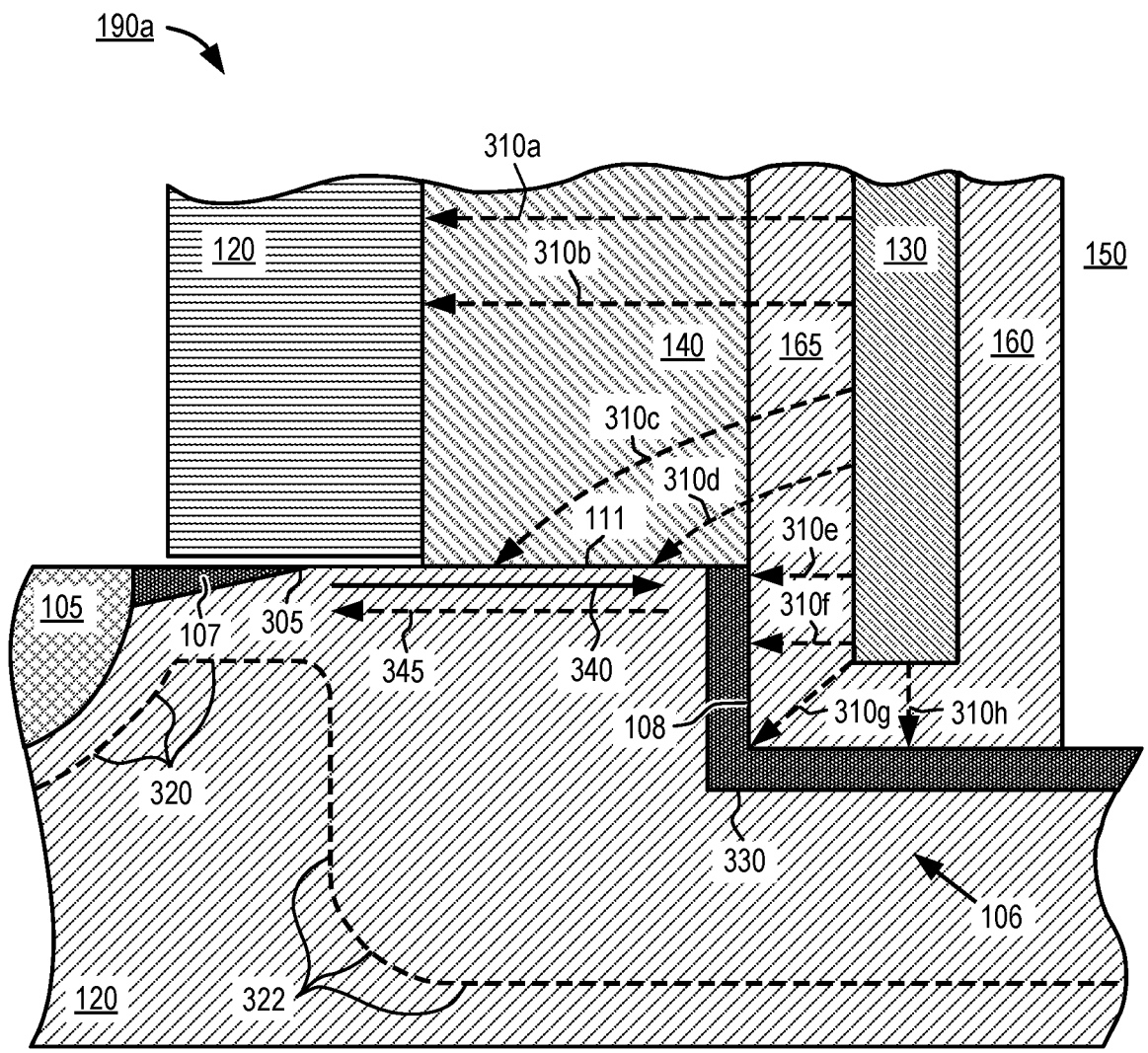
FIG. 3 is a diagram illustrating a programming operation of an electrically erasable programmable nonvolatile memory cell in accordance with some embodiments.

For programming the memory cell (step 230) in accordance with some embodiments, attention is first directed to FIG. 3, which illustrates another view (190*a*) of cutout 190 from FIG. 1A during a programming operation. Features shared with FIGS. 1A-C are similarly numbered, and some are not further discussed for purposes of brevity. Additional features depicted in FIG. 3 include a weak inversion layer 107, electric field lines 310*a-d* emanating from a portion of the floating gate disposed above the trench, electric field lines 310*e-h* emanating from a portion of the floating gate disposed inside the trench, a first depletion region 320, a second depletion region 322, a trench inversion layer 330, and a direction of electron flow 340. As is known in the art, electrons are attracted to positive voltage potentials, and are therefore pulled in directions opposite to the field line directions depicted in the figure.

To program the memory cell in accordance with some embodiments, the first bias potential (e.g., ground potential) is applied to the erase gate 170, and a fifth bias potential (e.g., a low voltage such as 0V, or a voltage between 0V and 0.5 V) is applied to drain region 104/105. A positive voltage level in the vicinity of the threshold voltage of the MOS structure (e.g., on the order of 0.2 to 0.7V above the voltage potential of the drain region) is applied to control gate 120. The voltages applied to drain region 104/105 and control gate 120 form a first depletion region 320 around the drain region 104/105 and channel portion 112 (FIG. 1B) of substrate 102. Further, a sixth bias potential higher than the fifth bias potential is applied to the control gate 120, and a seventh bias potential (e.g., a positive high voltage, for example on the order of 4V to 6V), higher than the sixth bias potential is applied to the source line 150.

The sixth bias potential applied to control gate 120 causes a weak inversion layer 107 to form in the substrate 102, connected to drain region 104/105 and having a pinch off point 305 located underneath control gate 120. Inversion layer 107 has a voltage close to that of drain region 104/105, as the very low sub-threshold current between the drain region and the pinch off point 305 causes only a very small voltage drop between the drain region and the pinch off point 305.

Applying the seventh bias potential (as noted above, a positive high voltage, e.g., on the order of 4V to 6V) to source line 150 causes a voltage of the floating gate 130 to rise in accordance with the seventh bias potential due to capacitive coupling between the source line and the floating gate, thereby causing electrons in a channel region of the substrate to gain energy and to be injected onto the floating gate. Because floating gate 130 is highly capacitively coupled to the source line 150, the voltage transition, e.g., from 0V to 4V, on source line 150 causes the voltage of floating gate 130 to increase proportionately to the voltage increase on source line 150. For example, in some embodiments, the voltage of the floating gate increases by at least 80 percent of the change in voltage on source line 150. The positive charges on floating gate 130 (e.g., due to floating gate 130 having previously been erased, plus the increase in voltage due to capacitive coupling with source line 150) in conjunction with the high voltage on source line 150 forms a second depletion region 322 (sometimes referred to herein as a deep depletion region) around the trench region 106 of substrate 102. Deep depletion region 322 has a larger depletion width than depletion region 320 due to the relatively higher voltage on source line 150. The larger depletion region 322 pushes pinch off point 305 toward the drain region 104/105, causing inversion layer 107 to be pinched off underneath control gate 120. The positive charges on floating gate 130 (e.g., due to floating gate 130 having previously been erased) further forms an inversion layer 330 surrounding the trench (channel portion 116, FIG. 1B). Inversion layer 330 has a voltage close to that of the source line, which is substantially higher than the voltage of inversion layer 107 (having a voltage close to that of the drain region). This difference in voltages between inversion layers 330 and 107 causes a voltage drop between inversion layer 330 and inversion layer 107. The voltage drop occurs in depletion region 322, and the resulting electric field due to the voltage drop is represented by field line 345 (in channel region 114, FIG. 1B).

The voltage on floating gate 130 is influenced by the positive charges on floating gate 130 (e.g., due to a previous erase operation), as well as the high voltage applied to source line 150 (due to the capacitive coupling between the floating gate and the source line). Accordingly, the voltage on floating gate 130 is substantially higher than the voltage on control gate 120, resulting in an electric field between the two, represented by field lines 310a-h in FIG. 3. In some embodiments, insulation region 140 is wide enough in the lateral direction that the distance between control gate 120 and floating gate 130 causes portions of the electric field between control gate 120 and floating gate 130, represented by field lines 310c-d in FIG. 3, to be directed towards the substrate surface 111. Specifically, for some portions of the floating gate 130 (e.g., portions that are closer to the surface 111 than the control gate 120), the adjacent electric field is directed downward towards the surface 111 due to the close proximity of charges in second channel portion 114 to floating gate 130.

At the beginning of a programming operation, a stream of electrons (sometimes called the programming current) from drain region 104/105 flows through inversion layer 107, moving randomly but having a net drift velocity in the direction represented by electron flow 340. The electrons traverse inversion layer 107 and proceed to pinch off point 305. The insulation region 140 disposed over the second channel portion 114, a control gate potential, and a source line potential are configured during a program operation to enable electrons to travel underneath a horizontal surface of the substrate (e.g., the horizontal surface of the substrate 102 separating insulation region 140 from second channel portion 114) in the lateral direction in the second channel portion 114.

After leaving pinch off point 305, electrons in the programming current are accelerated through depletion region 322 (channel portion 114, FIG. 1B) in the direction of electron flow 340 by the electric field represented by field lines 310c-f and 345. The accelerated electrons are referred to herein as hot electrons. The hot electrons traveling in electron flow 340 through depletion region 322 are influenced by an electric field favorable to a substantially lateral trajectory perpendicular to the trench sidewall 108 and located just below substrate surface 111 (referred to herein as a "head-on" trajectory, since electrons in the electron flow 340 collide with the sidewall 108 head on). Stated another way, the electric field represented by field line 345 attracts hot electrons in the programming current toward floating gate 130, while the electric field represented by field lines 310c-d prevents, or substantially reduces the portion of, hot electrons in the programming current from flowing downward into substrate 102, keeping the hot electrons on a head-on trajectory close to surface 111.

As the hot electrons in the programming current travel through depletion region 322 toward trench sidewall 108, some of those electrons with sufficient energy proceed to break through the substrate surface at sidewall 108 and enter insulation layer 165, located between floating gate 130 and trench sidewall 108. In some embodiments, an electron has sufficient energy to enter insulation layer 165 when its energy is higher than the energy barrier height at the interface between the silicon of substrate 102 and the dielectric material of insulation layer 165. After breaking into insulation layer 165, electrons are attracted by the electric field represented by field line 310e and injected onto floating gate 130.

Unlike prior art programming mechanisms, electrons in depletion region 320 do not require scattering to create a momentum component in the direction of floating gate 130. In fact, scattering is undesirable since it causes electrons in electron flow 340 to lose energy and change direction, which reduces the likelihood they will have sufficient energy to enter insulation layer 165 and be injected onto floating gate 130. Thus, in the programming mechanism of presently disclosed embodiments, electrons leaving inversion layer 107 (in channel region 112) are accelerated through depletion region 320 (in channel region 114). The electrons traveling in a head-on trajectory toward floating gate 130 with sufficient break-through energy to enter insulation layer 165 are ultimately injected onto floating gate 130. Even electrons in electron flow 340 that are scattered upward (toward surface 111), sideways, or slightly downward (away from surface 111) will still be injected onto floating gate 130 as long as they have sufficient energy to overcome the interface energy barrier. This head-on injection mechanism results in an increased proportion of electrons with sufficient break-through energy, which results in increased programming efficiency. Such improved program efficiency results in almost all of the high energy electrons in electron flow 340 being injected onto floating gate 130.

The injection of electrons onto floating gate 130, sometimes herein called the programming current, continues until either the programming voltages on source region 150 and control gate 120 are removed, or the voltage on floating gate 130 is so reduced by the electrons injected onto floating gate 130 that electrons in electron flow 340 no longer have sufficient energy to traverse insulation layer 165. Stated another way, the reduced voltage of the floating gate no longer sustains the generation of hot electrons. At this point, a "programmed state" for the floating gate is reached. In some embodiments, the programming current during programming is in the range of 10 nA to 100 nA, and in some embodiments, the programmed state is reached in 10 ns to 100 ns.

Read Operation

Finally, to read a selected memory cell (step 240) in accordance with some embodiments, the first bias potential (e.g., a ground potential) is applied to the source line 150. A fourth bias potential (e.g., a read voltage (e.g., 0.9 to 3V)) is applied to the drain region 104, and a third bias potential, sometimes called the read potential (e.g., a positive voltage (e.g., approximately 1 to 3V, depending upon the power supply voltage of the device supported by the given technology node)) is applied to the control gate 120.

If the floating gate 130 is positively charged (i.e., the floating gate is discharged of electrons, for example because the memory cell 100 has been erased and not subsequently programmed), then the third channel portion 116 is turned on by the formation of an inversion layer 330. When the control gate 120 is raised to the read potential, the first channel portion 112 is turned on by the formation of a strong inversion layer 107 in the substrate region below the control gate. In the second channel portion, the two depletion regions overlap with an electric field below the substrate surface 111 pointing from drain region 104/105 toward floating gate 130. As a result, the entire channel region, including channel portions 112, 114, and 116, favor an electron current in the direction of drain region 104/105. Accordingly, electrons flow from source line 150 (through the trench region 106 of the substrate, adjacent source line 150) to the drain region 104/105 through inversion layer 330 in channel portion 116, depletion region 322 in channel portion 114, and inversion layer 107 in channel portion 112. When the resulting electrical current (sometimes called the read current) is sensed, using circuitry in the memory device not shown, the memory cell is sensed to be in the "1" state or, equivalently, the "erased" state.

On the other hand, if the floating gate 130 is negatively charged, then no inversion layer forms in trench region 106 of the substrate. Consequently, the third channel portion 116 is either weakly turned on or entirely shut off and the width of depletion region 322 is reduced compared to the width of depletion region 322 when the floating gate 130 is positively charged (e.g., as a result of an erase operation). Further, the decreased width of depletion region 322 causes the depletion regions 322 and 320 to no longer overlap. Due to the gap in depletion regions, at least a portion of second channel portion 114 is not in a depletion region. As a result, even when control gate 120 and the drain region 104 are raised to the read potential, little or no current (sometimes called the read current) flows between source line 150 and drain region 104. In this case, either the read current is very small compared to that of the "1" state, or there is no read current at all. In this manner, the memory cell is sensed to be in the "0" state or, equivalently, in the "programmed" state.

In some embodiments, a ground potential is applied to the drain regions 104, source regions 150, and control gates 120 for non-selected columns and rows so that only the selected memory cell(s) is (are) read.

Plan View of Memory Array

Figure 4:
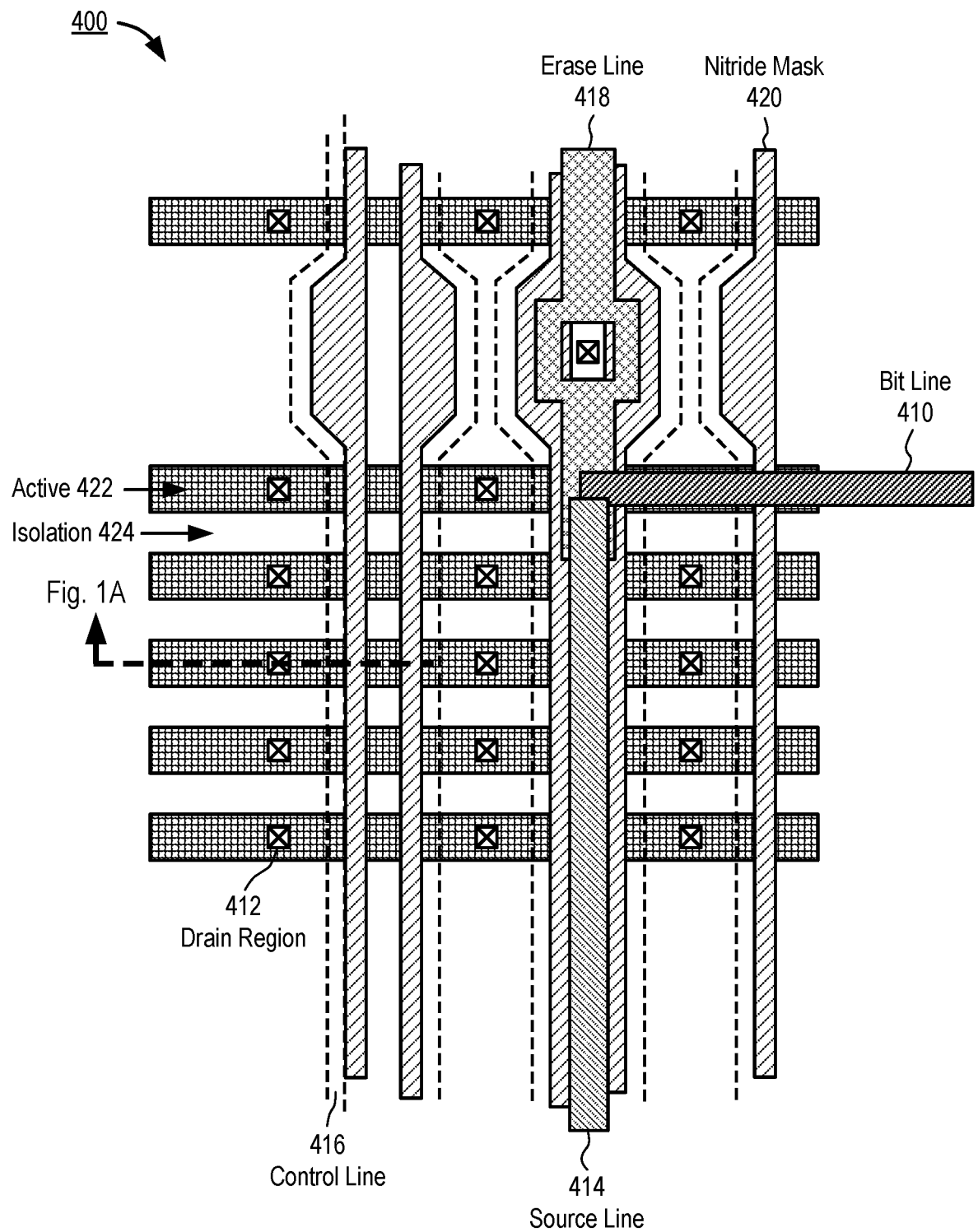
FIG. 4 is a diagram illustrating a plan view of a memory cell array in accordance with some embodiments.

Attention is now directed to FIG. 4, which illustrates a plan view of a memory cell array 400 in accordance with some embodiments. In some embodiments, bit lines 410 interconnect with drain regions 412. Control lines 416 and nitride masks 420 (removed in the manufacturing process) define the source lines, floating gates, and control gates, and extend across both the active regions 422 and the isolation regions 424. The source lines 414 electrically connect to the source regions for each row of paired memory cells. The floating gates are disposed in trenches in the active regions 422 underneath the erase lines 418.

Manufacturing Process

Figure 5A:
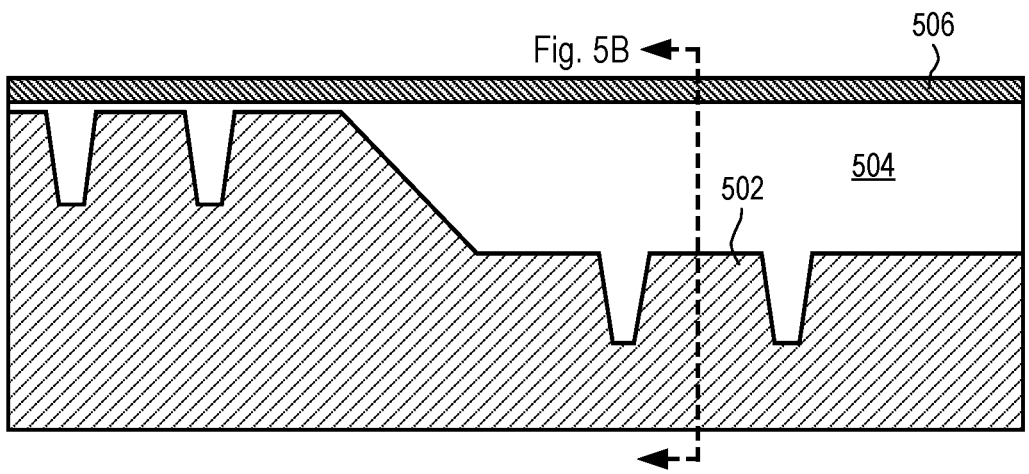
FIGS. 5A-M illustrate a process for manufacturing an array of electrically erasable programmable nonvolatile memory cells in accordance with some embodiments.
Figure 5B:
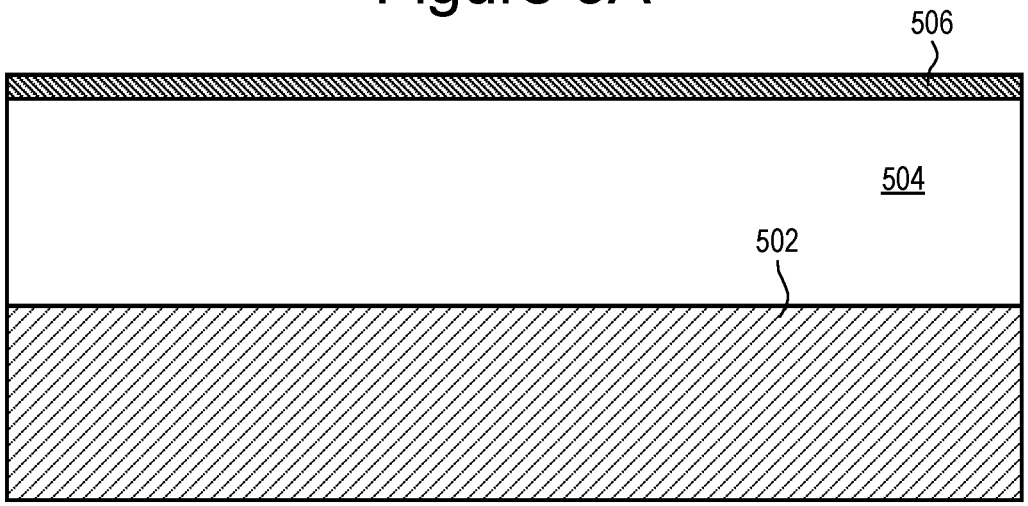
Figure 5C:
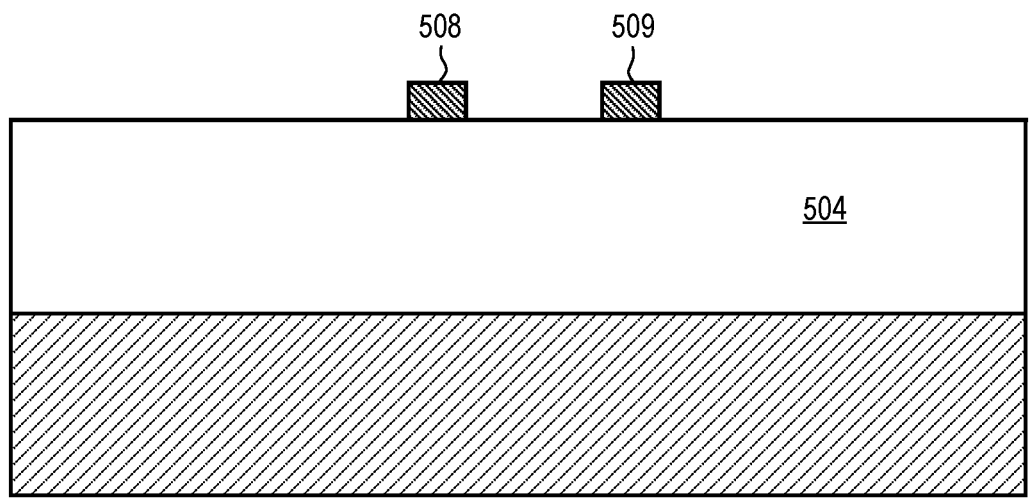

Attention is now directed to FIGS. 5A-M, which illustrate a process for manufacturing a memory cell in accordance with some embodiments. A process in accordance with some embodiments begins in FIG. 5A, which shows a cross-section view of silicon substrate 502 and an oxide layer 504, above which nitride 506 is deposited. A number of isolation trenches have already been removed from substrate 502, and the right hand portion of FIG. 5A shows a region, with oxide layer 504, that has been prepared for memory cell formation. FIG. 5B is another cross-section view, orthogonal to the cross-section view of FIG. 5A, along the bit-line direction (see FIG. 4). Next, as illustrated in FIG. 5C, the nitride layer 506 is etched, leaving a nitride mask with portions 508 and 509.

Figure 5D:
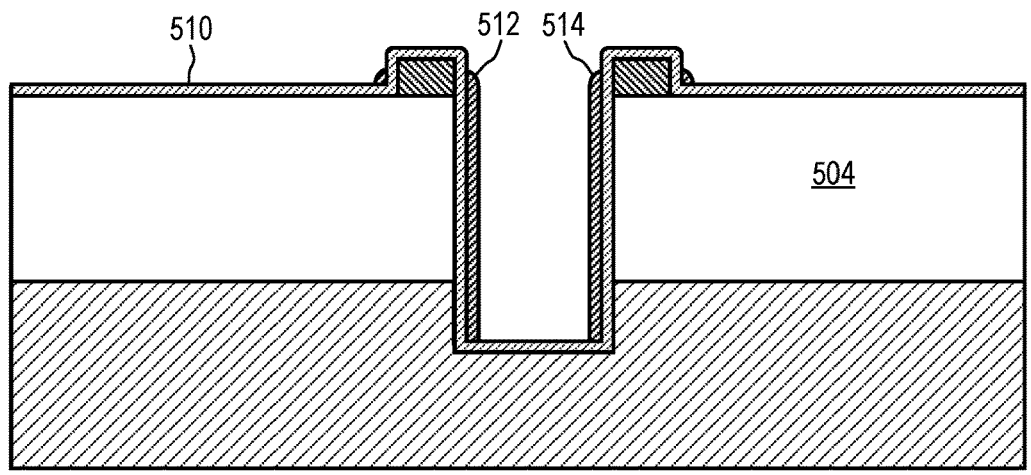
Figure 5E:
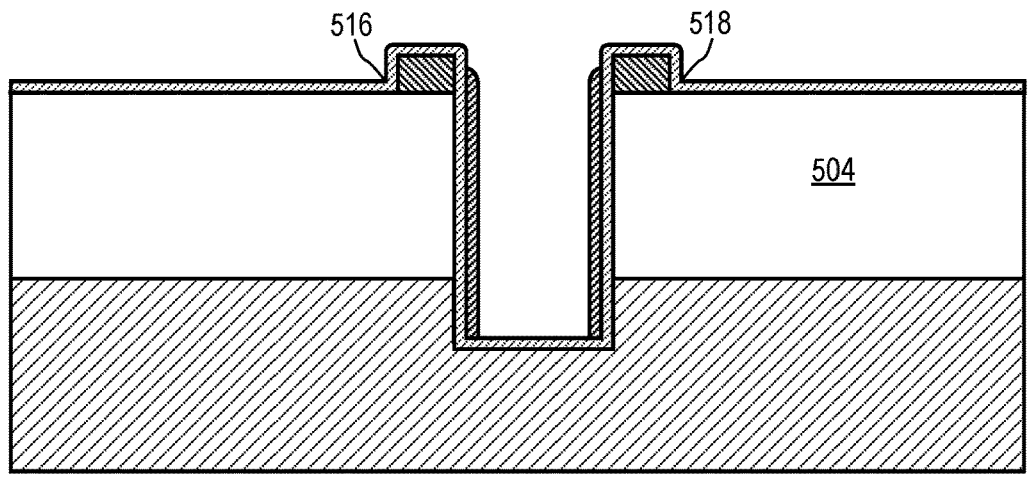
Figure 5F:
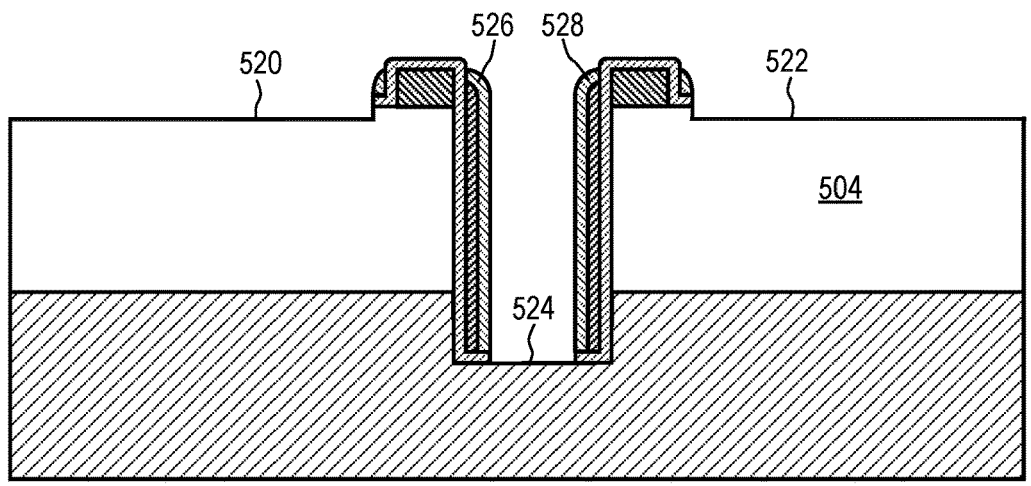

Next, as illustrated in FIG. 5D, a trench is etched through the oxide and silicon layers, between nitride mask portions 508 and 509. In some embodiments, the etching is performed by reactive ion etching ("RIE"). After the etching, a dielectric material 510 (e.g., high temperature oxide, referred to as "HTO") is deposited above the oxide layer, and doped polysilicon is deposited above the HTO. The polysilicon (sometimes herein called "poly") is etched using RIE in order to produce two separate floating gates 512 and 514. Next, as illustrated in FIG. 5E, after the processing steps of floating gate separation masking and etching, left-over poly is also isotropically etched from areas 516 and 518. Next, as illustrated in FIG. 5F, a dielectric layer is deposited and then anisotropically etched using RIE, forming coupling dielectric regions 526 and 528. The oxide at areas 520, 522, and 524 is etched away after such processing steps.

Figure 5G:
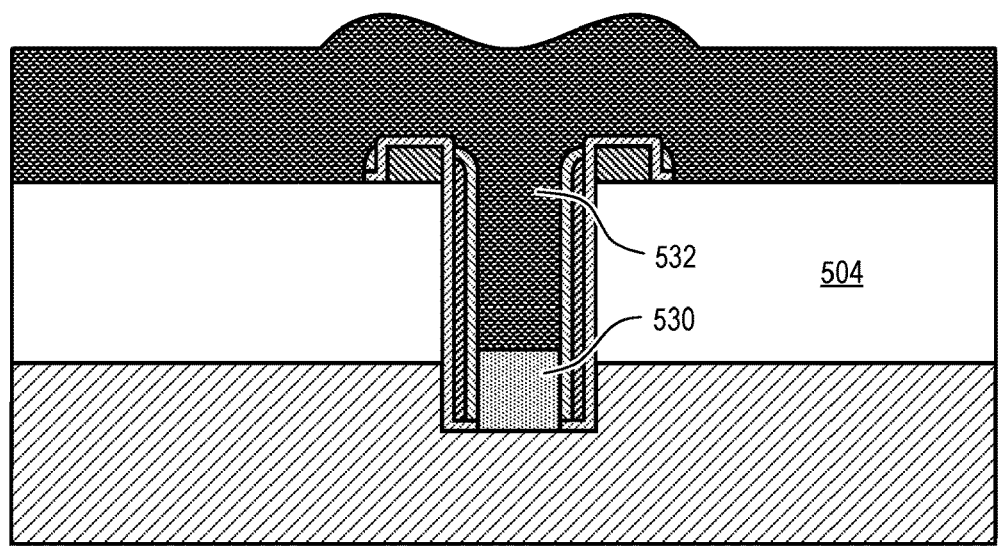
Figure 5H:
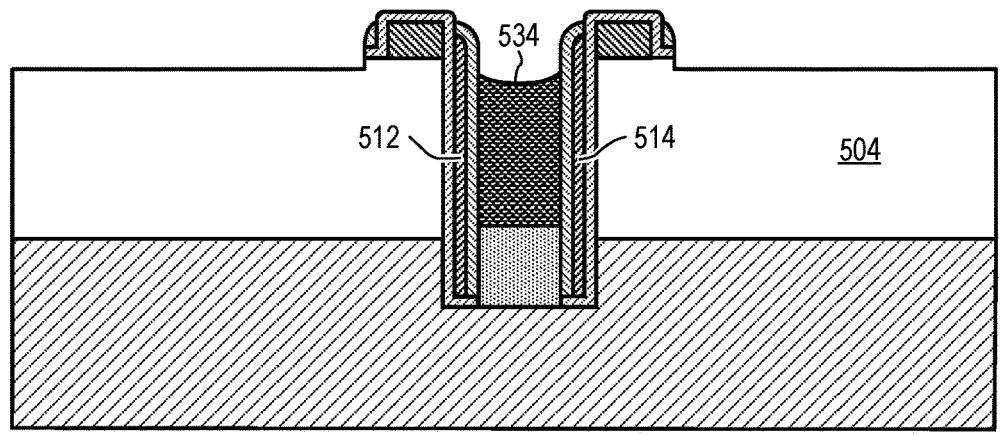

Next, as illustrated in FIG. 5G, to form a source line 534 (see FIG. 5H) in accordance with some embodiments, lightly doped amorphous silicon 530 is first deposited and then converted into single crystal silicon using a solid phase epitaxy ("SPE") process. An N-type dopant (e.g., arsenic or phosphorus) is then implanted and thermally driven in to form a heavily doped N+ layer 532 above the lightly doped silicon in the trench. An isotropic poly etch is then performed to remove the excess silicon outside the trench as shown in FIG. 5H to form the top of the source line 534. In other embodiments, processing steps in FIG. 5G and FIG. 5H are accomplished as follows: layers 530 and 532 are formed by first performing an epitaxial silicon growth step to selectively grow the N− single crystal silicon 530 at the trench bottom, followed by the deposition of heavily doped polysilicon 532. The excess polysilicon 532 outside the trench is isotropically etched away to form the top of the source line 534. As can be seen from the description of how source line 534 is formed, source line 534 and floating gate 512, are self-aligned due to the use of floating gates 512, 514 and coupling dielectric regions 526 and 528 to define the vertical boundaries of source line 534.

Figure 5I:
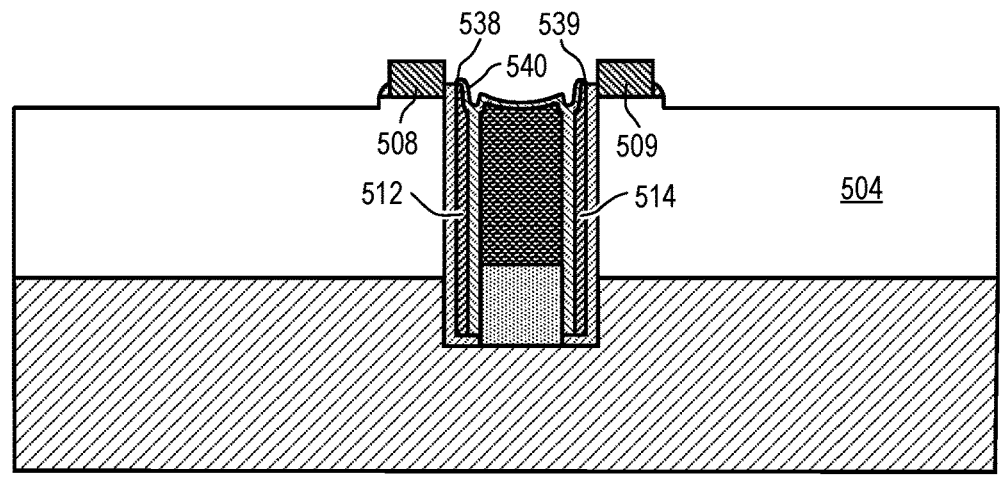

Next, as illustrated in FIG. 5I, a controlled amount of oxide is etched from the top and sides of the nitride mask portions 508 and 509, along with the exposed oxide covering the tip portions 538, 539 of the floating gates 512, 514. Then, a thin oxide layer 540 is thermally grown so as to protect the floating gate tips 538, 539 and the top of the source line silicon. This thermal oxide layer 540 growing step also sharpens the tips 538, 539 of the floating gates 512, 514.

Figure 5J:
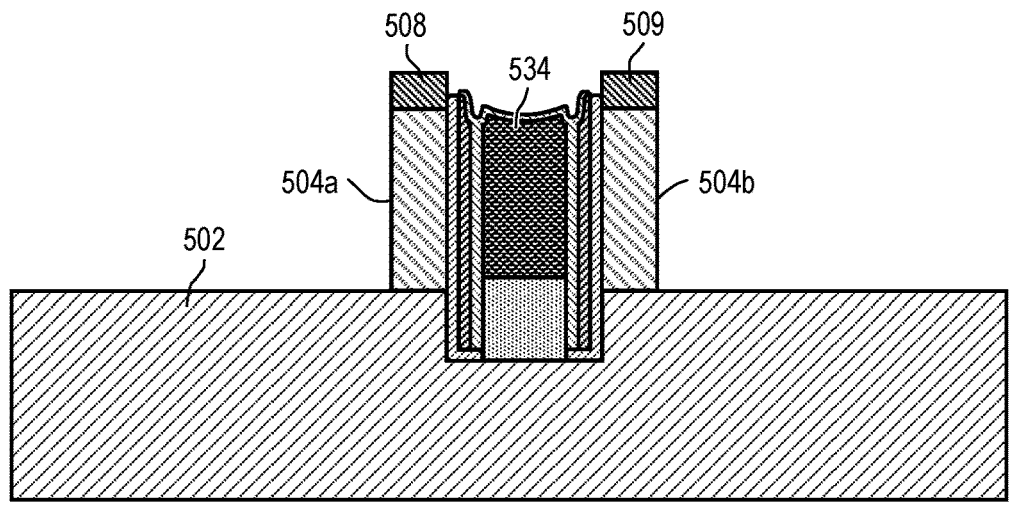
Figure 5K:
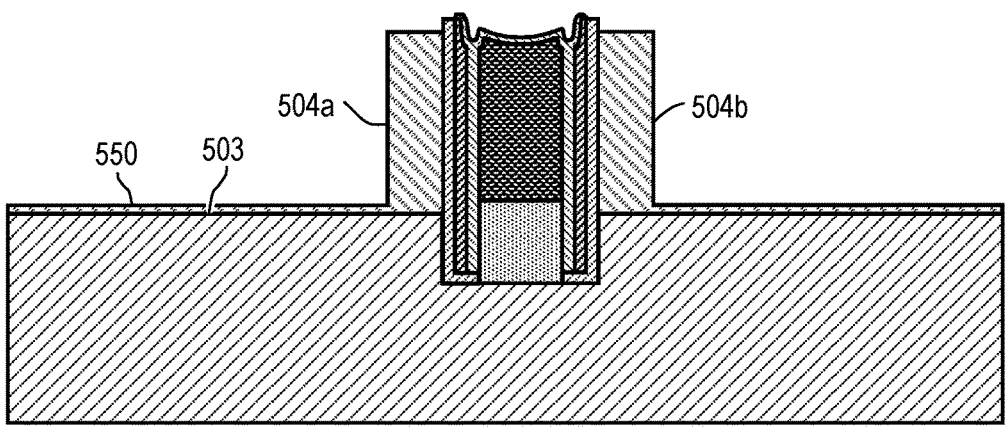
Figure 5L:
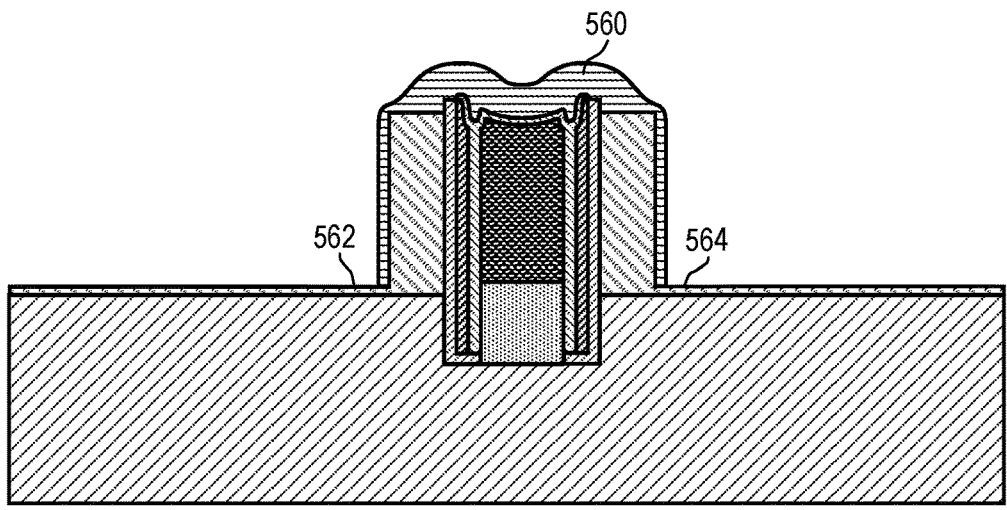
Figure 5M:
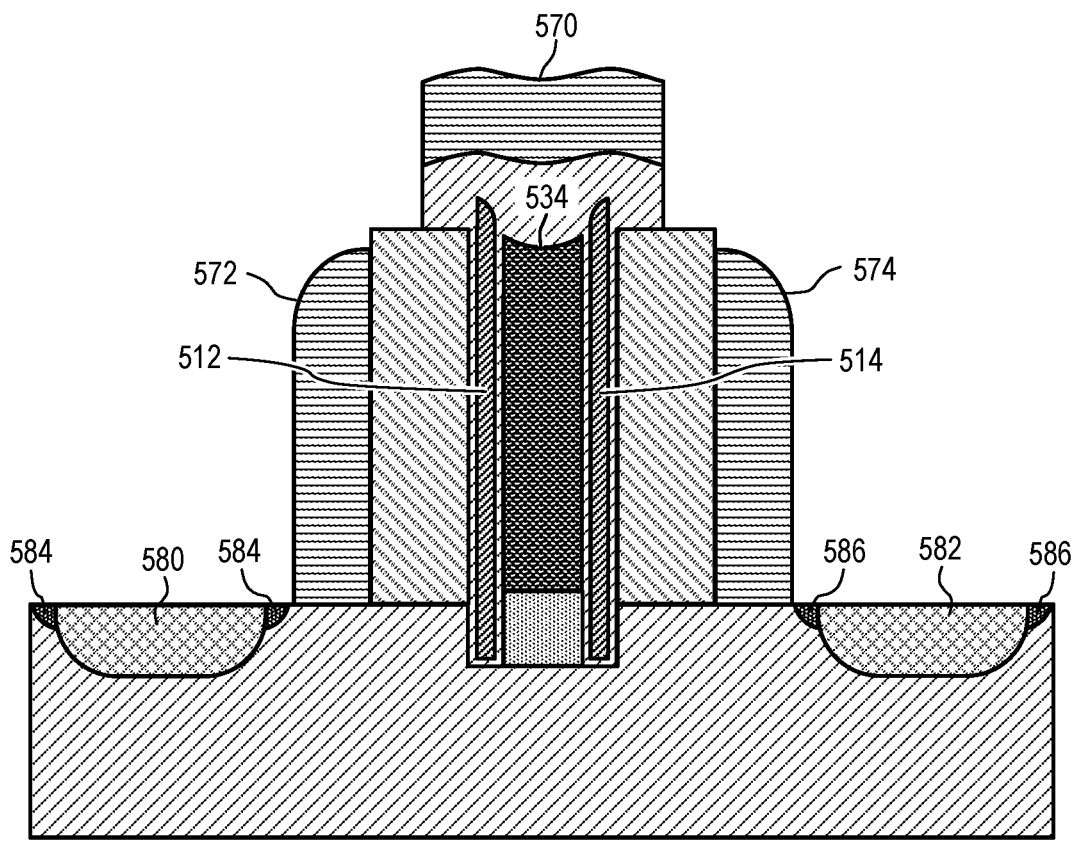

Next, as illustrated in FIG. 5J, the oxide layer 504 (see FIG. 5I) is etched using RIE. During the etch, nitride masks 508, 509 and another mask (not shown) protect floating gate tips 538, 539 and source line 534. Oxide regions 504a and 504b remain after the etch. In some embodiments, the RIE etch conditions are adjusted in order to minimize damage caused to the silicon 502. Next, as illustrated in FIG. 5K, a thin oxide layer 550 is grown above the silicon surface 503 in order to remediate damage to the silicon surface caused by the RIE process for etching oxide layer 504. In some embodiments, the oxidation also further sharpens the tips of the floating gates. Next, the nitride is stripped off of top of oxide regions 504a and 504b. Next, as illustrated in FIG. 5L, HTO 560 is deposited over the memory cell area in order to serve as a tunneling dielectric. In some embodiments, a thickness of the HTO is 100-300 angstroms. In other embodiments, a thickness of the HTO is up to 700 angstroms. In some embodiments, a mask is used to protect the floating gate tips, while HTO 560 is isotropically etched to remove excess oxide, for example along the sidewalls of oxide regions 504a, 504b. In some embodiments, oxide is anisotropically etched to remove oxide from areas 562 and 564 to prepare for formation of the control gates. Next, gate oxide is grown over areas 562 and 564, and poly is deposited, covering the entire memory array area including the gate oxide in regions 562 and 564. The poly is then masked and etched to form control gates 572, 574, as shown in FIG. 5M. In some embodiments, the same masking and etching steps used to form control gates 572, 574 are also used to define the erase gate 570, while in other embodiments erase gate 570 is formed using separate making and etching steps from those used to form control gates 572, 574.

Finally, lightly doped drain regions 584, 586 (e.g., drain regions adjacent control gates 572, 574) and drain regions 580, 582 are formed using processing steps well known in the semiconductor industry to form drain regions that include lightly doped drain (LDD) sub-regions adjacent neighboring transistor gates and more heavily doped drain sub-regions not adjacent the neighboring transistor gates, one example of which is described in U.S. Pat. No. 4,994,404, followed by contact formation and the subsequent metallization and other steps to complete the device manufacturing.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A memory array, comprising:
   a semiconductor substrate; and
   a plurality of electrically erasable programmable nonvolatile memory cells, wherein the plurality of electrically erasable programmable nonvolatile memory cells includes a first memory cell, the first memory cell including:
   a first substrate region of the semiconductor substrate and a trench region apart from the first substrate region in a lateral direction, the trench region comprising a bottom portion and a sidewall portion adjacent a trench in the semiconductor substrate;
   a channel region between the first substrate region and the bottom portion of the trench region, the channel region having:
      a first channel portion adjacent to the first substrate region;
      a second channel portion adjacent to the first channel portion and the trench region; and
      a third channel portion adjacent to the second channel portion and comprising the sidewall portion of the trench region;
   an electrically conductive control gate insulated from and disposed over the first channel portion but not over the second and third channel portions;
   an electrically conductive floating gate insulated from the bottom and sidewall portions of the trench region, the floating gate having:
      a first floating gate portion disposed inside the trench; and
      a second floating gate portion disposed above the trench and extending away from the trench, the second floating gate portion being electrically connected to the first floating gate portion on a first end and having a tip on a second end;
   an electrically conductive source line electrically connected to the trench region, the source line extending away from the semiconductor substrate; and
   an electrically conductive erase gate insulated from and disposed over the tip of the second floating gate portion.

2. The memory array of claim 1, wherein the source line of the first memory cell includes:
   a first source line portion disposed inside the trench and electrically connected to the bottom portion of the trench region, and
   a second source line portion disposed above the first source line portion, wherein the second source line portion is electrically more conductive than the first source line portion and is separated from the second floating gate portion by a dielectric layer.

3. The memory array of claim 1, wherein the third channel portion of the first memory cell is substantially perpendicular to the first and second channel portions.

4. The memory array of claim 1, wherein the first and second floating gate portions of the first memory cell are vertically oriented with respect to a horizontal surface of the semiconductor substrate.

5. The memory array of claim 1, wherein the electrically conductive source line of the first memory cell forms a first capacitive coupling with the floating gate and the erase gate forms a second capacitive coupling with the floating gate, and wherein the first capacitive coupling is greater than the second capacitive coupling.

6. The memory array of claim 5, wherein the first capacitive coupling is greater than the second capacitive coupling by a ratio of at least 10 to 1.

7. The memory array of claim 1, wherein the electrically conductive source line of the first memory cell forms a first capacitive coupling with the floating gate and the control gate forms a third capacitive coupling with the floating gate, and wherein the first capacitive coupling is greater than the third capacitive coupling.

8. The memory array of claim 7, wherein the first capacitive coupling is greater than the third capacitive coupling by a ratio of at least 5 to 1.

9. The memory array of claim 1, wherein the first memory cell further comprises an erase gate insulation region disposed between the erase gate and the tip of the second floating gate portion, the erase gate insulation region having a thickness permitting tunneling of electrons from the tip of the second floating gate portion to the erase gate.

10. The memory array of claim 9, wherein the erase gate insulation region thickness is greater than 200 angstroms and permits tunneling of electrons upon application of no greater than 10V to the erase gate.

11. The memory array of claim 1, wherein the first memory cell further comprises an insulation region disposed between the second channel portion and the floating gate, wherein the insulation region disposed between the second channel portion and the floating gate has a lateral thickness permitting head-on injection of electrons traveling in the second channel portion to the floating gate during a program operation.

12. The memory array of claim 1, wherein the first memory cell further comprises an insulation region disposed over the second channel portion between the control gate and the second floating gate portion, wherein the insulation region disposed over the second channel portion, a control gate potential, and a source line potential are configured to enable electrons to travel underneath a horizontal surface of the semiconductor substrate in the lateral direction in the second channel portion during a program operation.

13. The memory array of claim 2, wherein the second source line portion of the first memory cell is metal or polysilicon.

14. The memory array of claim 1, wherein the floating gate of the first memory cell is configured to reach a programmed state (i) upon application of a programming current of 10 nA to 100 nA, and/or (ii) in 100 ns or less.

15. The memory array of claim 1, wherein the erase gate of the first memory cell is configured to be erased during a concurrent program operation on a second memory cell of the memory array.

16. The memory array of claim 1, wherein the erase gate of the first memory cell is configured to be erased during a concurrent read operation on a second memory cell of the memory array.

17. A method of operating a memory array, the memory array comprising a substrate and a plurality of memory cells including a first memory cell, the first memory cell comprising a trench region comprising a bottom portion and a sidewall portion adjacent a trench in the substrate; a channel region between a drain region of the substrate and the trench region; a control gate insulated from and disposed over a portion of the channel region; a floating gate insulated from the bottom and sidewall portions of the trench region and having a first floating gate portion disposed inside the trench and a second floating gate portion disposed above the trench; a source line electrically connected to the trench region; and an erase gate insulated from and disposed over the second floating gate portion;
the method comprising:
erasing the first memory cell by:
applying a first bias potential to the control gate and the source line; and
applying a second bias potential to the erase gate, inducing tunneling of electrons from a tip of the second floating gate portion to the erase gate, wherein a capacitive coupling between the floating gate and the source line substantially limits changes in potential of the floating gate caused by capacitive coupling between the floating gate and the erase gate;
wherein a difference between the second bias potential and the first bias potential is no greater than 10 volts.

18. The method of claim 17, further comprising, after erasing the first memory cell, reading the first memory cell by:
applying the first bias potential to the source line;
applying a third bias potential to the control gate causing formation of an inversion layer in a substrate region below the control gate;
applying a fourth bias potential to the drain region of the substrate causing a current above a threshold to flow from the drain region to the source line if the floating gate is in a predefined erased state; and
sensing the current, if any, flowing from the drain region to the source line.

19. The method of claim 17, further comprising, after erasing the first memory cell, programming the first memory cell by:
applying the first bias potential to the erase gate;
applying a fifth bias potential to the drain region of the substrate;
applying a sixth bias potential higher than the fifth bias potential to the control gate; and
applying a seventh bias potential higher than the sixth bias potential to the source line, causing a voltage of the floating gate to rise in accordance with the seventh bias potential due to capacitive coupling between the source line and the floating gate, and thereby causing electrons in the channel region to gain energy and to be injected onto the floating gate.

20. The method of claim 19, wherein the electrons injected onto the floating gate cause the first memory cell to reach a programmed state (i) upon application of a programming current of 10 na to 100 nA, and/or (ii) in 100 ns or less.

21. The method of claim 17, further comprising programming a second memory cell of the memory array concurrently with erasing the first memory cell.

22. The method of claim 17, further comprising reading a second memory cell of the memory array concurrently with erasing the first memory cell.

* * * * *